United States Patent [19]
Fujita

[11] 4,350,949
[45] Sep. 21, 1982

[54] BIDIRECTIONAL SWITCHING CIRCUIT WITH CONTROL TERMINAL

[75] Inventor: Shinichi Fujita, Hamamatsu, Japan

[73] Assignee: Nippon Gakki Seizo Kabushiki Kaisha, Hamamatsu, Japan

[21] Appl. No.: 210,255

[22] Filed: Nov. 25, 1980

[30] Foreign Application Priority Data

Dec. 4, 1979 [JP] Japan ................... 54-157046

[51] Int. Cl.³ .............................. G05F 1/20
[52] U.S. Cl. ......................... 323/284; 307/255; 307/252 B; 323/237
[58] Field of Search .............. 307/252 B, 255; 323/237, 273, 274, 282, 284

[56] References Cited

U.S. PATENT DOCUMENTS

| | | | |
|---|---|---|---|
| 3,619,656 | 11/1971 | Domke | 307/252 B X |
| 3,731,182 | 5/1973 | Hirono et al. | 307/252 B X |
| 4,069,446 | 1/1978 | Yonehara | 307/252 B X |

*Primary Examiner*—William M. Shoop
*Attorney, Agent, or Firm*—Spensley, Horn, Jubas & Lubitz

[57] ABSTRACT

A switching circuit whose current-to-voltage characteristic across a first terminal and a second terminal is a bidirectional and symmetrical breakdown characteristic, and arranged especially so that said breakdown voltage will vary in accordance with the variation of voltage applied to a controlling terminal. Said switching circuit, in case it is used as a trigger circuit for controlling the firing angle of a bidirectional thyristor, unfailingly performs actuation of the bidirectional thyristor without being much affected by such factors as the fluctuations of the power supply frequency and the power supply voltage.

13 Claims, 12 Drawing Figures

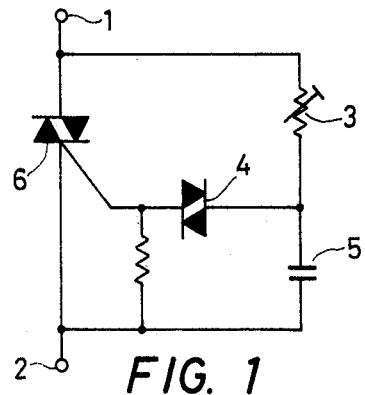
FIG. 1
PRIOR ART
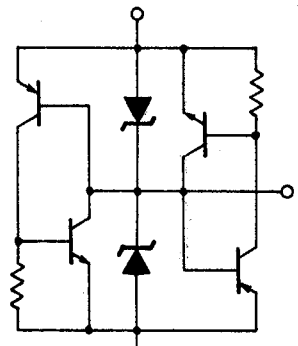
FIG. 2A
PRIOR ART
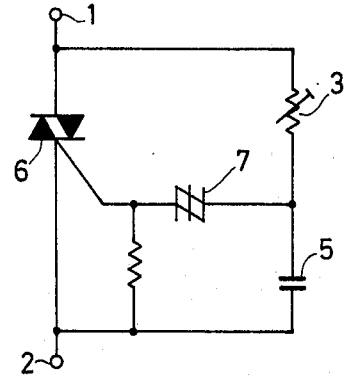
FIG. 2B
PRIOR ART
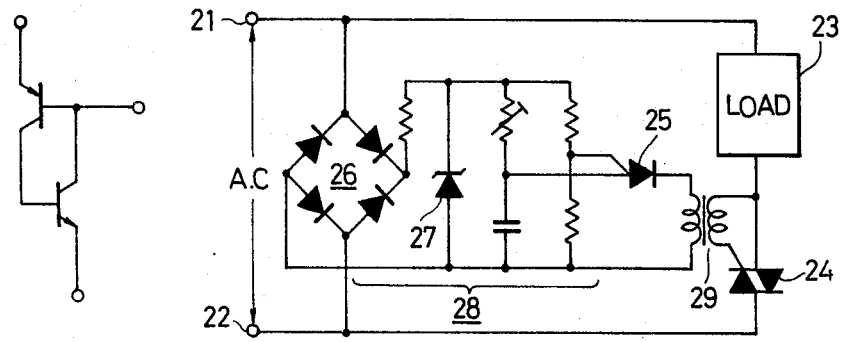
FIG. 3A
PRIOR ART
FIG. 3B
PRIOR ART

BIDIRECTIONAL SWITCHING CIRCUIT WITH CONTROL TERMINAL

BACKGROUND OF THE INVENTION (a) Field of the Invention

The present invention relates to a bidirectional switching circuit, more particularly a switching circuit for triggering a bidirectional thyristor such as TRIAC which is a trademark of a product of General Electric, Inc. of U.S.A.

(b) Description of the Prior Art

A bidirectional thyristor, in general, when employed as, for example, a power controlling element of a power supply circuit requires a switching circuit as a triggering element or a circuit for triggering this bidirectional thyristor. As the triggering elements of this type, there have been proposed and placed on the market various elements such as DIAC (Diode AC Switch), SBS (Silicon Bilateral Switch) and PUT (Programmable Uni-Junction Transistor). Among them, a DIAC is arranged to be operative so that, for example, in such circuit as shown in FIG. 1, when a voltage which is applied to a DIAC 4 across terminals 1 and 2 and via a resistor 3 has reached a certain value (usually about 30 V), the electric charge which has been stored in a capacitor 5 is caused to flow to a gate of a bidirectional thyristor 6 to render this thyristor 6 conductive. And, by the use of this circuit, it is possible to control the firing angle of the bidirectional thyristor 6 by varying the resistance value of the resistor 3.

Also, as SBS may be expressed by its equivalent circuit which is of such arrangement as shown in FIG. 2A. For example, in a circuit shown in FIG. 2B (which is a circuit as shown in FIG. 1 wherein the DIAC 4 is substituted by an SBS 7), the SBS is designed to be operative so that, when a voltage applied to the SBS 7 has reached a certain voltage level (usually about 8 V), the bidirectional thyristor 6 is rendered conductive in a manner same as that performed by the aforesaid DIAC.

Furthermore, a PUT may be expressed by an equivalent circuit which is arranged as shown in FIG. 3A. This PUT is used in a manner as, for example, shown in FIG. 3B. This circuit shown in FIG. 3B is intended, in a circuit for supplying to a load 23 an ac voltage applied across terminals 21 and 22, to trigger by a PUT 25 a bidirectional thyristor 24 which is inserted between the terminal 22 and the load 23. Since this PUT is a unidirectional element, this circuit is provided with a rectifying circuit 26 for driving the PUT 25 and a driving circuit 28 which is comprised of a Zener diode 27 and other elements. This circuit is arranged to be operative so that, when the PUT 25 is rendered conductive, an electric current is allowed to flow to the primary side of a transformer 29, and that the bidirectional thyristor 24 is triggered by a voltage induced on the secondary side of the transformer 29.

Among those elements described above, the DIAC and the SBS have the inconveniences such that, when these elements are employed in such circuits as shown in FIG. 1 and FIG. 2B, the charge-up time of the capacitor 5 varies in accordance with the frequency of the voltage applied across the terminals 1 and 2, so that the timing at which the DIAC 4 or the SBS 7 is rendered conductive will vary in accordance with this frequency. Thus, there is the drawback that the values of the resistor 3 and the capacitor 5 require to be varied in accordance with the frequency of the voltage which is applied. More particularly, in the circuits shown in FIG. 1 and FIG. 2B wherein these elements are employed, if the values of the resistor 3 and the capacitor 5 are set in such way that, for example, these circuits are actuated by a commercial power supply with a frequency of 50 Hz, there could happen that the timing for rendering the DIAC 4 or the SBS 7 conductive is influenced by the power supply frequency in such manner that there arises an instances wherein the circuits are not actuated by a commercial power supply with a frequency of 60 Hz. Also, when such circuitry is connected to a power supply, if a commercial power is applied, for example, at half-way of a half cycle of the power which is supplied, the charge-up of the capacitor 5 will be commenced exactly at the time the commercial power is applied. Therefore, there will arise an instance wherein there is not performed a charge-up of the capacitor 5 to an extent enough for rendering either the DIAC 4 or the SBS 7 conductive before the termination of this half cycle. Such operations will constitute factors to make the set firing angle unstable.

Also, in case the circuit shown in FIG. 1 or FIG. 2B is a circuit intended for controlling the power of the power supply circuit, i.e. in case it is a circuit arranged so that the bidirectional thyristor 6 shown in these Figures is inserted in a power supply line for a load, and that the resistor 3 is comprised of a variable resistor, so as to be operative that the fluctuation of the voltage applied to the load is detected to control the value of this resistor 3 to compensate for said fluctuation of the voltage to thereby control the firing angle of the bidirectional thyristor 6, there will arise the following problem. That is, because the controlling of the resistor 3 is performed only when the bidirectional thyristor 6 is rendered conductive at the time the circuit is connected to the power supply, there would arise an instance wherein the actuation of the bidirectional thyristor 6 is not carried out at all depending on the condition of the resistor 3 at the time the circuit is connected to the power supply, i.e. an instance wherein the value of the resistor 3 is extremely large so that the capacitor 5 is not charged up. Thus, there is the drawback that the actuation of the bidirectional thyristor 6 becomes unstable. Furthermore, such known arrangement, in conjunction with the inconvenience that the timing at which the bidirectional thyristor 6 is rendered conductive would vary depending on the difference in the power supply frequency such as 50 Hz and 60 Hz, would make the actuation of the bidirectional thyristor 6 all the more unstable.

Also, the PUT, when used in such manner as shown in FIG. 3B, is able to eliminate the drawback and inconvenience of the aforesaid DIAC and SBS. On the other hand, however, the PUT has no bidirectional characteristic, so that there is required a driving circuit 28 having such complicated arrangement as shown in FIG. 3B, and also there is required a transformer 29. Thus, the PUT has the drawback that the resulting circuit becomes costly.

SUMMARY OF THE INVENTION

It is, therefore, a primary object of the present invention is to provide a bidirectional switching circuit, having a control terminal, which permits its bidirectional current flow.

Another object of the present invention is to provide a trigger circuit for a bidirectional thyristor, which is able to perform actuation of the bidirectional thyristor without being substantially affected by the frequency of power supply.

Still another object of the present invention is to provide a trigger circuit for a bidirectional thyristor as described above, which is able to perform with certainty the actuation of the bidirectional thyristor without being substantially affected by the fluctuation of the power supply voltage.

Yet another object of the present invention is to provide a trigger circuit for a bidirectional thyristor as described above, which, even when it is utilized for a bidirectional thyristor intended for power-controlling of the power supply circuit, is able to perform, with certainty, the actuation of the bidirectional thyristor.

A further object of the present invention is to provide a trigger circuit for a bidirectional thyristor as described above, which can be materialized with a simple circuit arrangement, and which does not produce any big problem with respect to the fabricating cost of the circuit.

BRIEF DESCRIPTION OF THE DRAWINGS

FIG. 1 is a known trigger circuit diagram employing a DIAC.

FIG. 2A is a known equivalent circuit diagram of an SBS.

FIG. 2B is a known trigger circuit diagram employing an SBS.

FIG. 3A is a known equivalent circuit diagram of a PUT.

FIG. 3B is a known trigger circuit diagram employing a PUT.

DETAILED DESCRIPTION OF THE PREFERRED EMBODIMENTS

Some embodiments of the present invention will hereunder be described by referring to FIGS. 4 to 10.

Figure 4:
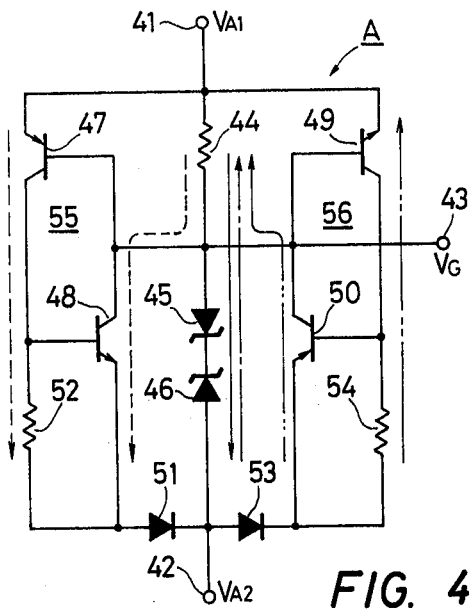
FIG. 4 is a diagram of an embodiment of a bidirectional switching circuit according to the present invention.

FIG. 4 is a circuit diagram showing the arrangement of a bidirectional switching circuit A according to the present invention. In FIG. 4, reference numerals 41 and 42 represent a first terminal and a second terminal, respectively, and 43 a controlling terminal. Between the first terminal 41 and the controlling terminal 43 is connected a resistor 44. Between the controlling terminal 43 and the second terminal 42 are connected Zener diodes 45 and 46 in series. In this instance, the Zener diode 45 is forward from the controlling terminal 43 toward the second terminal 42, whereas the Zener diode 46 is forward from the second terminal 42 toward the controlling terminal 43. And, the controlling terminal 43 is connected to a base of a pnp-type transistor 47, and also to a collector of an npn-type transistor 48, and further to a base of an npn-type transistor 49 and also to a collector of a pnp-type transistor 50. Furthermore, the first terminal 41 is connected to an emitter of the transistor 47, and to an emitter of the transistor 49. Also, the second terminal 42 is connected to the collector of the transistor 47 via a diode 51 and a resistor 52 which are connected in series in this order, and also to the base of the transistor 48. Concurrently therewith, said second terminal 42 is connected to the collector of the transistor 49 via a diode 53 and a resistor 54 which are connected in series in this order, and to the base of the transistor 50. In this instance, the diode 51 is forward from the resistor 52 toward the second terminal 42, whereas the diode 53 is forward from the second terminal 42 toward the resistor 54. Also, the emitter of the transistor 48 is connected to a connecting point of the diode 51 and the resistor 52. The emitter of the transistor 50 is connected to a connecting point of the diode 53 and the resistor 54. In the arrangement described above, the transistors 47 and 48, and the resistor 52 jointly constitute a first circuit means 55 which is operated in such manner that, when the relationship between the voltages applied to the said respective terminals 41 to 43 satisfies a certain condition which will be described later, conduction is established between the first terminal 41 and the second terminal 42 in a direction from the terminal 41 toward the terminal 42, and also that this conducting state is self-held. Similarly, the transistors 49 and 50, and the resistor 54 jointly constitutes a second circuit means 56 which is operative so that, when the aforesaid voltage relationship satisfies another condition which will be also described later, conduction is established between the second terminal 42 and the first terminal 41 in a direction from the terminal 42 toward the terminal 41, and also that this conducting state is self-held.

Description will next be made of the operation of the switching circuit A having the foregoing arrangement.

To begin with, this switching circuit A is operative so that, when a predetermined voltage is applied across the first and the second terminals 41 and 42 and when the value of this applied voltage rises above a breakover voltage, $V_z$, conduction is established between these first and second terminals 41 and 42 with a bidirectional characteristic. For example, let us assume that a predetermined voltage is applied across the first and the second terminals 41 and 42, and that the relationship between the potential $V_{A1}$ at the first terminal 41 and the potential $V_{A2}$ at the second terminal 42 is $V_{A1} > V_{A2}$. Under such assumption as mentioned above, if the base-emitter voltage of the transistor 47 is assumed to be $V_{BE1}$, and the forward voltage drop of the Zener diode 45 is designated as $V_{F1}$, and also the Zener voltage of the Zener diode 46 as $V_{R1}$ and if there is obtained the relationship: $V_{A1} - V_{A2} > V_{BE1} + V_{F1} + V_{R1}$, the Zener diodes 45 and 46 are rendered conductive, so that the transistors 47 and 48 are both rendered conductive, whereby conduction is established between the first and the second terminals 41 and 42. More particularly, in this state, an electric current is allowed to flow between the first and the second terminals 41 and 42 through the paths as indicated by the solid line and the broken lines in FIG. 4. In such instance, the lowest operating voltage $V_z$ required for the circuit A to become conductive is: $V_z = V_{BE1} + V_{F1} + V_{R1}$. In view of the fact that voltages $V_{BE1}$ and $V_{F1}$ are both trifle voltages, said voltage $V_z$ is determined mainly by the voltage $V_{R1}$.

Figure 5:
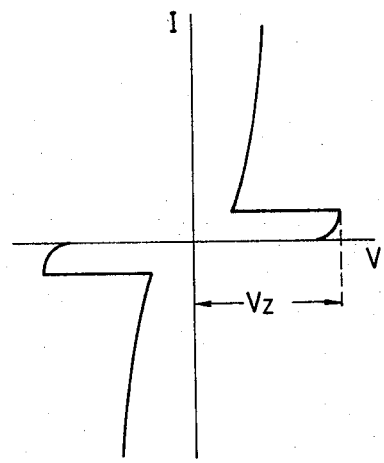
FIG. 5 is a voltage-to-current characteristic chart of the bidirectional switching circuit shown in FIG. 4.

Also, in case there is obtained the relationship: $V_{A2} - V_{A1} > V_{BE2} + V_{F2} + V_{R2}$ (wherein: $V_{BE2}$ represents the base-emitter voltage of the transistor 49, $V_{F2}$ represents the forward voltage drop of the Zener diode 46, and $V_{R2}$ represents the Zener voltage of the Zener diode 45) when the relationship between the aforesaid potentials $V_{A1}$ and $V_{A2}$ is $V_{A1} < V_{A2}$, the Zener diodes 45 and 46 are rendered conductive in the same manner as that described above, and accordingly the transistors 49 and 50 are also rendered conductive, whereby conduction is established between the first and the second terminals 41 and 42. In this instance, the current paths between the first and second terminals 41 and 42 will be the paths as indicated by a one-dot chain line and two-dots chain lines in FIG. 4. It should be understood here that in the aforesaid respective operations, the diodes 51 and 53 serve to prevent the application of a reverse voltage across the emitter and the base of the transistors 48 and 50. And, the voltage-to-current characteristic of the switching circuit A in these operations will be as shown in FIG. 5. It should be noted here also that, in the subsequent description, these operations will be called generally a first behavior.

The aforesaid switching circuit A is operative so that, even when the value of the voltage applied across the first and the second terminals 41 and 42 is less than $V_z$, conduction is established between these first and second terminals 41 and 42 with a bidirectional characteristic in accordance with the value of the voltage $V_G$ which is applied to the controlling terminal 43. Let us suppose, for example, that the relationship between the potential $V_{A1}$ at the first terminal 41 and the potential $V_{A2}$ at the second terminal 42 is $V_{A1} > V_{A2}$. Then, in case the relationship between the potential $V_{A1}$ at the first terminal 41 and the potential $V_G$ at the controlling terminal 43 (which are potentials relative to the second terminal 42) has become: $V_{A1} > V_G + V_{BE1}$, the transistors 47 and 48 are rendered conductive so that conduction will be established between the first and the second terminals 41 and 42 in such way that a current is allowed to flow as indicated by the broken lines in FIG. 4. Also, in case a relationship: $V_{A1} < V_G + V_{BE2}$ is obtained when the relationship between said potentials $V_{A1}$ and $V_{A2}$ is $V_{A1} < V_{A2}$, the transistors 49 and 50 are rendered conductive, so that conduction is established between the first and the second terminals 41 and 42 in such way that an electric current flows as indicated by two-dots chain lines shown in FIG. 4. It should be noted here that, in the following description, these operations are called generally a second behavior.

Thus, this switching circuit A is operative such that, by controlling the voltages applied to the first and the second terminals 41 and 42 and to the controlling terminal 43, "on-off" actions established between the first and the second terminals 41 and 42, whereby the bidirectional thyristor can be triggered by utilizing the electric current flowing across these terminals 41 and 42.

Figure 6:
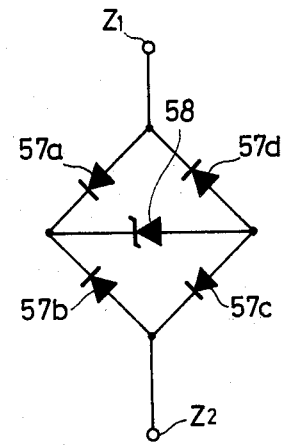
FIG. 6 is a diagram of a circuit substituting a series circuit of Zener diodes shown in FIG. 4.

It should be understood also that, in the aforesaid switching circuit A, the series circuit of the Zener diodes 45 and 46 connected between the controlling terminal 43 and the second terminal 42 may be substituted by such circuit as that shown in FIG. 6. This circuit is comprised, in a bridge connection, of diodes 57a, 57b, 57c and 57d, and a Zener diode 58. In the diode bridge-type rectifying circuit which is arranged so that the respective cathodes of the diodes 57a and 57b are connected in common, that the respective anodes of the diodes 57c and 57d are connected in common, that the anode of the diode 57a is connected to the cathode of the diode 57d, and that the anode of the diode 57b is connected to the cathode of the diode 57c, the cathode of the Zener diode 58 and the anode thereof are connected to the common connecting point of said cathode and also to the common connecting point of said anodes, respectively. In this circuit, it should be understood that, in case a terminal $Z_1$ and a terminal $Z_2$ are connected to the controlling terminal 43 and the second terminal 42, respectively, in place of the series circuit comprised of the Zener diodes 45 and 46 in FIG. 4, the Zener voltage $V_R$ can be made equal for both directions between the first and the second terminals. In case a transformer is employed as a load as will be discussed later, it becomes especially necessary to make the positive and the negative firing angles equal to each other from the viewpoint of suppressing the occurrence of such inconveniences as magnetic deviation due to a dc bias current flow. That is, in case there is a difference between the positive firing angle and the negative firing angle, there will arise a difference between the positive region and the negative region of a waveshape of voltage, and this would be identical with the instance wherein either a positive or a negative dc bias current flows. For this reason, the variation of the current relative to the variation of voltage will become extremely great, which will lead to a damage of the bidirectional thyristor, and accordingly to the breakage of the windings of the transformer. Thus, there is the necessity for making the positive and the negative firing angles equal relative to the each other. In case arrangement is provided so as to obtain a Zener voltage $V_R$ by the use of such circuit as that shown in FIG. 6 for the purpose of prevention of the occurrence of, for example, a magnetic deviation due to a dc bias current, the employment of only one Zener diode would be enough. Therefore, it is possible to equalize the Zener voltages for both directions and also to equalize the positive and the negative firing angles with easiness without requiring such complicated procedure as the selection of Zener diodes having an identical characteristic which are necessary when two of them are used.

Figure 7:
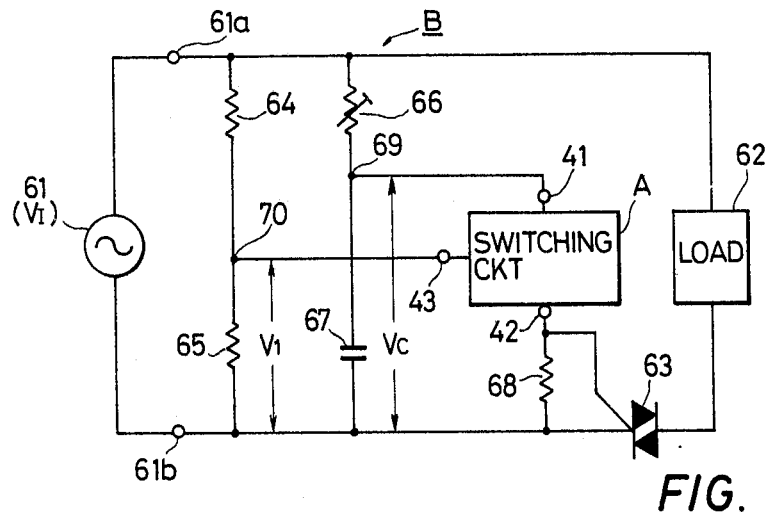
FIG. 7 is a diagram of a power supply circuit incorporating the switching circuit shown in FIG. 4.

FIG. 7 is a circuit diagram showing an example of a power supply circuit provided with a trigger circuit indicated generally at B which contains therein the switching circuit A shown in FIG. 4. The power supply circuit shown therein arranged so that, in a circuit intended for supplying the power of the ac power supply 61 to a load 62, a bidirectional thyristor 63 is inserted in series between an ac power supply 61 and a load 62, so as to control the firing angle of this bidirectional thyristor 63 by the trigger circuit B. The arrangement of the circuit shown in FIG. 7 is such that the symbol A represents a bidirectional switching circuit having the arrangement shown in FIG. 4, and in this Figure it is indicated by a block. Between a first power supply terminal 61a and a second power supply terminal 61b of the ac power supply 61 are connected a resistor 64 and another resistor 65 in series in this order, and also inserted a variable resistor 66 and a capacitor 67 in series in this order. Also, between the second terminal 42 of the switching circuit A and the power supply terminal 61b is connected a resistor 68. And, this switching circuit A is arranged so that its first terminal 41 is connected to a connecting point 69 of the variable resistor 66 and the capacitor 67, and that the second terminal 42 is connected to the gate of the bidirectional thyristor 63, and also that the controlling terminal 43 is connected to a connecting point 70 of the resistors 64 and 65. In the circuit arrangement described above, the variable resistor 66 is a light-receiving section of such means as a photo-coupler, and is arranged so that its value will vary as the amount of light from a light-emitting section of such means as said photo-coupler is controlled in accordance with a voltage applied to the load 62.

Next, description will be made of the operation of the circuit having the foregoing arrangement.

To begin with, the value $R_v$ of the variable resistor 66 is such that, when the bidirectional thyristor 63 is in its "off" state, said light-emitting element does not emit light, so that it has a very high value. In case $R_v >> 0$ as stated above, the switching circuit A will perform the aforesaid second behavior. More particularly, under the foregoing condition, if the voltage $V_I$ at the power supply terminal 61a exhibits a gradual rise in, for example, its positive half cycle of the voltage $V_I$, a charge-up current will flow to the capacitor 67 through the path: the power supply terminal 61a→the resistor 64→the controlling terminal 43 of the switching circuit A→the resistor 44 of the switching circuit A→the first terminal 41 of the switching circuit A. Thus, the capacitor 67 is charged up. And, as the voltage at the power supply terminal 61a gradually drops beyond its maximum value, and when the relationship between the voltage $V_c$ across the capacitor 67 and the voltage $V_1$ across the resistor 65 becomes $V_1 < V_c$ near the termination of the positive half cycle, the switching circuit A will perform the aforesaid second behavior, to thereby establish conduction between the first and the second terminals 41 and 42. Thus, this switching circuit A discharges the electric charge stored in the capacitor 67, to thereby supply a trigger pulse to the gate of the bidirectional thyristor 63. As a result, the bidirectional thyristor 63 is turned "on", and the voltage of the power supply 61 is supplied to the load 62. Also, this circuit will operate in the same way as that described above for the negative half cycle also.

When the bidirectional thyristor 63 is turned "on", the value $R_v$ of the variable resistor 66 will decrease owing to the fact that a predetermined voltage is applied to the load 62. And, in case this value $R_v$ has decreased up to a predetermined level, the trigger circuit A will perform the aforesaid first behavior. That is, at such time, a charge-up current is supplied to the capacitor 67 through the aforesaid path in case the voltage at the power supply terminal 61a makes a gradual rise for the positive half cycle for example, and at the same time, there is concurrently supplied a charge-up current also through the path: the power supply terminal 61a→the variable resistor 66. And, when there is brought about such condition that the value of said voltage $V_c$ exceeds the operating voltage $V_z$ of the switching circuit A, the switching circuit A will perform the first behavior in the manner as described above, so that conduction is established across the first terminal 41 and the second terminal 42, thereby supplying a trigger pulse to the bidirectional thyristor 63. Also, this circuit will operate in the same way as described above for the negative half cycle of the voltage $V_I$. It should be understood here that, in case the value $R_v$ of the variable resistor 66 is large after the actuation of the bidirectional thyristor 63 and accordingly in case said voltage $V_c$ does not reach the aforesaid voltage $V_z$, the switching circuit A will perform the second behavior to control the firing angle of the bidirectional thyristor 63.

Figure 8:
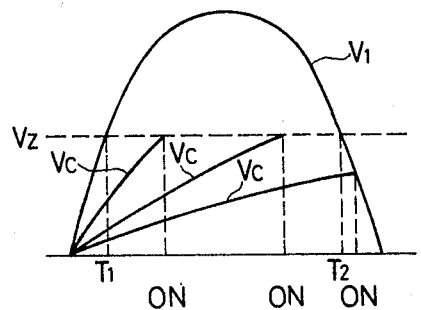
FIG. 8 is a diagram for explaining the triggering action of the circuit shown in FIG. 7.

FIG. 8 is a diagram showing the timing at which the switching circuit A is rendered conductive for the positive half cycle in the aforesaid operations. It should be understood here that $V_1$ is based on the assumed voltage across the resistor 65 when the connecting point 70 is not connected with the controlling terminal 43. As shown in FIG. 8, the switching circuit A is operative so that, when the voltage $V_c$ has exceeded, by a voltage $V_{BE1}$, the voltage $V_1$ near the termination of the positive half cycle of the voltage $V_1$, the switching circuit A performs the second behavior so as to turn the bidirectional thyristor 63 "on". When, subsequently, the level of the voltage $V_c$ has exceeded the level of the operating voltage $V_z$ of the switching circuit A, the switching circuit A performs the first behavior to turn the bidirectional thyristor 63 "on".

The circuit shown in FIG. 7 is operative so that, initially, it actuates the bidirectional thyristor 63 by the second behavior of the switching circuit A, and thereafter it controls the firing angle of this bidirectional thyristor by the first and the second behaviors of said switching circuit A. In such instance, the extent of the control of the firing angle for the bidirectional thyristor 63 would become extremely broad because the respective scopes of the first and second behavior are combined together. In this circuit of FIG. 7, when the bidirectional thyristor 63 is actuated near the termination of the half cycle of the power supply voltage $V_I$, the actuation of the bidirectional thyristor is performed by the second behavior of the switching circuit A based on a comparison between the voltage $V_c$ and the voltage $V_1$. Because of such behavior of the circuit, even in case the frequency of the voltage of the ac power supply 61 is switched between, for example, 60 Hz and 50 Hz, the actuation of the bidirectional thyristor 63 can be performed without fail. Also, even when the voltage of the power supply 61 fluctuates, it is also possible to actuate the bidirectional thyristor 63 without fail due to the same reason as that stated above.

Figure 9:
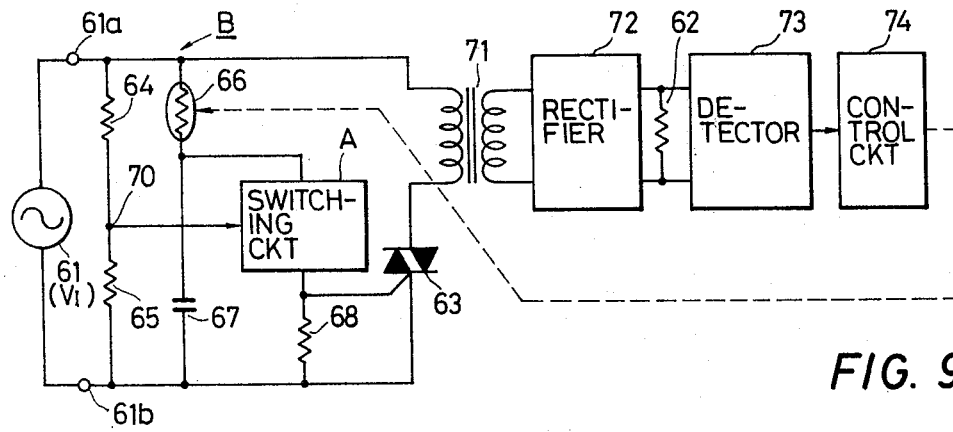
FIG. 9 is a diagram of a stabilized power supply circuit incorporating the switching circuit shown in FIG. 4.

FIG. 9 is a diagram showing an example of stabilized power supply circuit which is provided with the trigger circuit B shown in FIG. 7. The stabilized power supply circuit shown therein is an example of concrete circuit arrangement of the power supply circut shown in FIG. 7. In this Figure, those constitutional elements and parts similar to those of FIG. 7 are indicated by like reference numerals and symbols. The stabilized power supply circuit shown in FIG. 9 is arranged so that a power supply voltage $V_I$ across power supply terminals 61a and 61b is supplied to the primary winding of a transformer 71 via a bidirectional thyristor 63 which is controlled of its firing angle by a trigger circuit B, and the voltage derived across the secondary winding of the transformer 71 is subjected to rectification and smoothing by a rectifying circuit 72, so as to be supplied to a load 62. This stabilized power supply circuit is intended to be operative so that the fluctuation of the voltage applied to the load 62 or the fluctuation of the power consumed by the load 62 is detected by a detecting circuit 73, and that the value of a variable resistor 66 is controlled by a controlling circuit 74 based on the result of the detection. With this stabilized power supply circuit, the firing angle of the bidirectional thyristor 63 is controlled by the trigger circuit B in accordance with the voltage applied to the load 62, whereby the power which is supplied to the load 62 via the transformer 71 is controlled, so that the voltage applied to the load 62 can be held constant.

Figure 10:
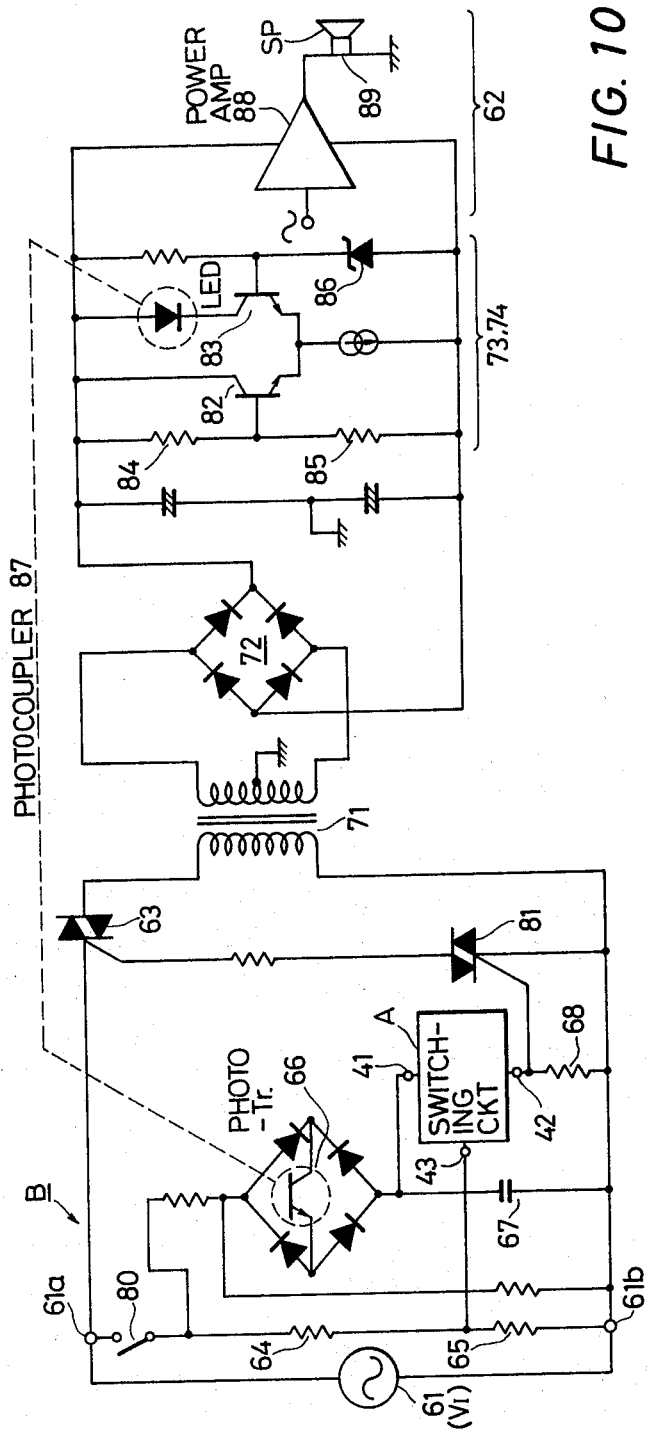
FIG. 10 is a concrete circuit diagram of the stabilized power supply circuit shown in FIG. 9.

FIG. 10 is a circuit diagram showing a further concrete circuit arrangement of the stabilized power supply circuit shown in FIG. 9. In FIG. 10, those elements and parts similar to those FIG. 9 are indicated by like reference numerals and symbols, and their explanation is omitted. In FIG. 10, reference numeral 80 represents a power supply switch which is inserted so as to perform make-and-break actions of the charge-up path of a capacitor 67 of a trigger circuit B which is intended to actuate a bidirectional thyristor 63. Reference numeral 81 represents a bidirectional thyristor which is inserted so as to trigger, in two step operation, said bidirectional thyristor 63. A rectifying circuit 72 is constructed by a bridge-type rectifying circuit which, in turn, is comprised of four diodes. A detecting circuit 73 is formed with a comparator which, in turn, is composed of bipolar transistors 82 and 83, and is operative so that an output voltage from the rectifying circuit 72 is divided by a voltage-dividing circuit composed of resistors 84 and 85, and the resulting voltage is compared with the voltage derived across a Zener diode 86, and the result of detection is exhibited as a current (amount of light) of a light-emitting diode of a photo-coupler 87 which is inserted in the collector circuit of the transistor 83. A controlling circuit 74 is comprised of the light-emitting diode of said photo-coupler 87 and a photo-transistor, and is operative so that by utilizing its photo-transistor to serve as a variable resistor element 66, so that the value of the resistance of this photo-transistor 66 is adapted to be controlled by the amount of light of said light-emitting diode. Reference numerals 88 and 89 represent a power amplifier and a speaker, serving as a load 62, respectively.

What is claimed is:

1. A bidirectional switching circuit having a first terminal, a second terminal and a controlling terminal, comprising:
   a first resistor means connected between said first terminal and said controlling terminal;
   a threshold circuit connected between said controlling terminal and said second terminal for allowing an electric current to flow between these two terminals with a bidirectional characteristic when an absolute value of a voltage applied across said controlling terminal and said second terminal exceeds a predetermined level;
   a first circuit means connected between said first terminal and said second terminal for establishing conduction between said first terminal toward said second terminal when a voltage exceeding a first predetermined voltage is applied between the first terminal and controlling terminal, and for self-holding the condition of said conduction;
   a second circuit means connected between said first terminal and said second terminal for establishing conduction between said second terminal and said first terminal in a direction from said second terminal toward said first terminal when a voltage exceeding a second predetermined voltage is applied between the first terminal and the controlling terminal, and for self-holding the condition of said conduction;
   said first circuit means having a first control terminal connected to said controlling terminal;
   said second circuit means having a second control terminal connected to said controlling terminal; and
   said first and second predetermined voltages being equal in magnitude and opposite in polarity to each other.

2. A circuit according to claim 1, wherein said threshold circuit is comprised of two Zener diodes connected in opposite directions and in series relative to each other.

3. A circuit according to claim 2, wherein said two Zener diodes are identical in their Zener voltage and their forward voltage drop.

4. A circuit according to claim 1, wherein said threshold circuit is comprised of diode-bridge type rectifying circuit comprised of four diodes and a Zener diode connected in opposite polarity between output terminals of said diode-bridge type rectifying circuit, and wherein respective input terminals of said diode-bridge type rectifying circuit are connected respectively to said controlling terminal and said second terminal.

5. A circuit according to claim 1, wherein:
   said first circuit means comprises:
   a first transistor of a pnp type having a emitter connected to said first terminal, a base connected to said controlling terminal, and a collector; and
   a second transistor of an npn type having a base connected to said collector of said first transistor, a collector connected to said controlling terminal, and an emitter connected to said second terminal; and wherein
   said second circuit means comprises:
   a third transistor of an npn type having an emitter connected to said first terminal, a base connected to said controlling terminal, and a collector; and
   a fourth transistor of a pnp type having a base connected to said collector of said third transistor, a collector connected to said controlling terminal, and an emitter connected to said second terminal.

6. A circuit according to claim 5, further comprising a second resistor means connected between the base and the emitter of said second transistor; and a third resistor means connected between the base and the emitter of said fourth transistor.

7. A circuit according to claim 5, further comprising: a first diode connected forwardly between the emitter of said second transistor and said second terminal, and a second diode connected forwardly between the emitter of said fourth transistor and said second terminal.

8. A trigger circuit for a bidirectional thyristor in a power supply circuit having a first terminal, a second terminal and a controlling terminal, comprising:
   first resistor means connected between said first terminal and said controlling terminal;
   a threshold circuit connected between said controlling terminal and said second terminal for allowing an electric current to flow between these two terminals with a bidirectional characteristic when an absolute value of a voltage applied across said controlling terminal and said second terminal exceeds a predetermined level;
   a first circuit means connected between said first terminal and said second terminal for establishing conduction between said first terminal and said second terminal in a direction from said first terminal toward said second terminal when a voltage exceeding a first predetermined voltage is applied between the first terminal and the controlling terminal, and for self-holding the condition of said conduction; and a second circuit means connected between said first terminal and said second terminal for establishing conduction between said second terminal and said first terminal in a direction from said second terminal toward said first terminal when a voltage exceeding a second predetermined voltage is applied between the first terminal and the controlling terminal, and for self-holding the condition of said conduction;

said first circuit means having a first control terminal connected to said controlling terminal;

said second circuit means having a second control terminal connected to said controlling terminal; and said first and second predetermined voltages being equal in magnitude and opposite in polarity to each other.

9. A power supply circuit including as part thereof a trigger circuit as in claim 8, said power supply circuit comprising:

a voltage divider circuit means connected between a first power supply terminal and a second power supply terminal for dividing a power supply voltage to be applied to said controlling terminal;

fourth resistor means having one end connected to said second terminal and the other end connected to said second power supply terminal;

a charge-up circuit means comprised of a series circuits formed with fifth resistor means and capacitor means connected between said first power supply terminal and said second power supply terminal, a common connecting point of said fifth resistor means and capacitor means being connected to said first terminal; and a bidirectional thyristor connected between said first power supply terminal and said second power supply terminal via a load, and having a gate controlled by a signal of said second terminal.

10. A circuit according to claim 9, wherein said voltage divider circuit is comprised of a series circuit formed with sixth resistor means and seventh resistor means, and a common connecting point of said sixth resistor means and said seventh resistor means is connected to said controlling terminal.

11. A circuit according to claim 9, further comprising:

a rectifying and smoothing circuit means for rectifying and smoothing said power supply voltage whose firing angle is controlled by said bidirectional thyristor, and having said load connected to an output side thereof.

12. A circuit according to claim 11, further comprising:

a voltage detecting circuit means for detecting fluctuations of a voltage applied to said load; and a controlling circuit means for controlling a resistance value of said fifth resistor means by a detection signal delivered from said voltage detecting circuit means.

13. A circuit according to claim 12, wherein said controlling circuit means is a light-emitting element adapted to be controlled of its amount of emitting light by a detection signal delivered from said voltage detecting circuit means, and said fifth resistor means is comprised of photo-transistor adapted to be varied of its resistance value by an amount of light received from said light-emitting element.

* * * * *